United States Patent
Na et al.

(10) Patent No.: US 8,558,569 B2
(45) Date of Patent: Oct. 15, 2013

(54) OPENER FOR TEST HANDLER

(75) Inventors: Yun-Sung Na, Cheonan-si (KR);
Tae-Hung Ku, Hwaseong-si (KR);
Jung-Woo Hwang, Hwaseong-si (KR)

(73) Assignee: TechWing Co., Ltd., Hwaseong-si (KR)

( * ) Notice: Subject to any disclaimer, the term of this patent is extended or adjusted under 35 U.S.C. 154(b) by 263 days.

(21) Appl. No.: 13/083,829

(22) Filed: Apr. 11, 2011

(65) Prior Publication Data

US 2011/0265316 A1    Nov. 3, 2011

(30) Foreign Application Priority Data

Apr. 30, 2010 (KR) .................. 10-2010-0040487

(51) Int. Cl.
*G01R 31/20* (2006.01)
(52) U.S. Cl.
USPC ............. 324/757.01; 324/757.04; 324/756.02
(58) Field of Classification Search
USPC ....................... 324/756.02, 754.09
See application file for complete search history.

(56) References Cited

U.S. PATENT DOCUMENTS

| 4,535,887 | A | * | 8/1985 | Egawa ........................ 206/724 |
| 5,227,717 | A | * | 7/1993 | Tsurishima et al. ..... 324/754.11 |
| 5,675,957 | A | * | 10/1997 | Kim ............................. 53/242 |
| 2008/0298946 | A1 | | 12/2008 | Shim et al. |
| 2009/0196719 | A1 | * | 8/2009 | Na et al. .................... 414/225.01 |
| 2010/0207638 | A1 | * | 8/2010 | Nien et al. .................... 324/537 |

FOREIGN PATENT DOCUMENTS

| CN | 1855453 A | | 11/2006 |
| CN | 101366109 A | | 2/2009 |
| JP | 10-107483 | * | 4/1998 |

* cited by examiner

*Primary Examiner* — Richard Isla Rodas
(74) *Attorney, Agent, or Firm* — Jefferson IP Law, LLP

(57) ABSTRACT

An opener for a test handler is provided. Even when holding members of inserts of a carrier board are manipulated to release semiconductor devices that have been in a held state, a predetermined distance can remain between an upper surface of the opening plate and a lower surface of the insert, thus preventing the inserts from becoming defective.

2 Claims, 7 Drawing Sheets

OPENER FOR TEST HANDLER

PRIORITY

This application claims the benefit under 35 U.S.C. §119 (a) of a Korean patent application filed on Apr. 30, 2010 in the Korean Intellectual Property Office and assigned Serial No. 10-2010-0040487, the entire disclosure of which is hereby incorporated by reference.

BACKGROUND OF THE INVENTION

1. Field of the Invention:

The present invention relates to an opener for a test handler that is used to test semiconductor devices.

2. Description of the Related Art:

As is well known to those skilled in the art, test handlers assist testers in testing semiconductor devices manufactured by predetermined processes, sort the semiconductor devices into different levels according to the test results, and load the semiconductor devices into customer trays. Such test handlers have been disclosed in many publication documents, for example, in Korean Patent Registration No. 10-0553992 (entitled "Test handler"), the entire disclosure of which is hereby incorporated by reference.

Generally, the produced semiconductor devices are loaded into the customer trays and then supplied to the test handlers. The semiconductor devices supplied to the test handlers are loaded onto a carrier board that is located at a loading position. Subsequently, the semiconductor devices are tested at a testing position while being on the carrier board. Thereafter, the semiconductor devices are unloaded into the custom trays when the carrier board is located at an unloading position. The term "carrier board" refers to a loading device that can load a plurality of semiconductor devices thereon to assist a tester to test multiple semiconductor devices at a time. Such carrier boards are classified as test trays that have been used in conventional arts, and test boards that have been newly developed.

As can be understood above, the carrier board continuously circulates along a path including the loading position, the testing position, and the unloading position. Therefore, to prevent the loaded semiconductor devices from being displaced from correct positions or losing their balance due to a shock occurring when the carrier board moves or change its posture, a holding device for holding the semiconductor devices is provided on the carrier board.

In this case, it is necessary to release the semiconductor devices from the holding device to load or unload the semiconductor devices at the loading position or the unloading position. To achieve this purpose, a separate opener for releasing the held state of the semiconductor devices is required.

One example of a technique for releasably holding semiconductor devices loaded onto inserts of a carrier board was proposed in Korean Patent Laid-open Publication No. 10-2009-0102167 (entitled "Insert opening unit for teat tray and method for mounting semiconductor devices using the same", hereinafter, referred to as "prior art 1"), the entire disclosure of which is hereby incorporated by reference.

In general, referring to the prior art 1 (particularly, in FIGS. 1 and 8 of the prior art 1), the opening unit is configured in such a way that rotatable holding members can hold semiconductor devices, and opening pins provided on an opening plate (called a main body) of the opening unit can rotate the holding members to release the held state of the semiconductor devices.

In detail, when the opening plate is advanced towards inserts of the carrier board and brought into close contact with the inserts, the opening pins push the holding members upwards to reversely rotate the holding members so that the holding members enter the state of being able to release the semiconductor devices. When the opening plate moves away from the inserts of the carrier board, the holding members are rotated in the forward direction by the restoring force of springs so that the holding members are returned to the state of being able to hold the corresponding semiconductor devices.

To make the manipulation of the holding members using the opening pins smooth, the carrier board must not be pushed beyond an allowed level when the opening plate comes into close contact with the inserts of the carrier board. For this, as shown in FIG. 12 attached to the specification of Korean Patent Application No. 10-2009-0063752 (entitled: Insert opener, insert and carrier board), the entire disclosure of which is hereby incorporated by reference, a separate guide rail was proposed to prevent the carrier board from being pushed.

Meanwhile, BGA type semiconductor devices have ball-shaped electrical contact points on the rear surface thereof. As shown in FIG. 9 of Korean Patent Laid-open Publication No. 10-2009-0084007 (entitled: "Carrier board type insert for test handler"), the entire disclosure of which is hereby incorporated by reference, a plurality of opening holes are formed in the bottom of a loading portion of the insert so that balls of a BGA type semiconductor device are inserted into the corresponding openings. As such, in the case of the insert having the opening holes (or depressions), if the opening holes are distorted by defects of the insert, for example, being twisted, the balls of the semiconductor device that have been inserted into the opening holes may be undesirably tightly caught by the opening holes. This causes a defect of the operation of unloading the semiconductor devices from the inserts. In other words, when unloading, a pick-and-place apparatus for transporting the semiconductor devices may not be able to correctly hold the semiconductor devices to transport them from the insert.

The defects of the insert result from the fact that the upper surface of the opening plate is not parallel to the inserts of the carrier board due to defective production or the carrier board being bent with the passage of time so that when the opening plate comes into contact with the inserts, the contact pressure of the opening plate cannot be evenly applied to the inserts. In other words, the contact pressure of the opening plate that is continuously unevenly applied to the rear surfaces of the inserts becomes a factor resulting in a defect of the insert, for example, causing a twist of the insert. Furthermore, if the opening plate is not horizontally advanced to the inserts of the carrier board, the opening plate cannot uniformly apply force to the inserts (in the case of the opening plate described below, 32 holding members of the inserts are simultaneously operated by only one opening plate); for example, excessive force may be unevenly applied to some of the inserts, thus causing a twist of the inserts.

The above problems of the inserts being twisted are more frequently caused in an insert disposed in FIG. 5b of Korean Patent Application No. 10-2009-0063752, the entire disclosure of which is hereby incorporated by reference. This insert shown in FIG. 5b of No. 10-2009-0063752 is configured such that seating surfaces onto which semiconductor devices are placed are separated from each other, unlike Korean Patent Application No. 10-2009-0063752 in which the seating surfaces are integrated together, so that the insert is easily twisted by slight uneven force applied to the lower surface of the insert. Therefore, the inserts have been typically produced in such a way that the seating surfaces of the insert are integrated together to more reliably resist a twist compared to the case of FIG. 5b of No. 10-2009-0063752. However, if a customer requires a structure in which the seating surfaces of the insert are separated from each other to use the portions by which the seating surfaces are separated for other purposes, the insert may avoidably have the structure of FIG. 5b of No. 10-2009-0063752.

SUMMARY OF THE INVENTION

Aspects of the present invention are to address at least the above-mentioned problems and/or disadvantages and to provide at least the advantages described below. Accordingly, an aspect of the present invention is to provide an opener for test handlers that are configured such that close contact force of an opening plate is prevented from being applied to an insert.

Another aspect of the present invention is to provide an opener for test handlers that can correctly conduct an opening operation even when a semiconductor device is dropped onto the opening plate.

In accordance with an aspect of the present invention, an opener for a test handler is provided. The opener includes an opening plate provided below an insert of a carrier board, the insert having a holding member to hold a semiconductor device loaded onto the insert, the opening plate having an opening pin manipulating the holding member to release a held state of the semiconductor device loaded onto the insert, and a drive source moving the opening plate towards or away from the insert of the carrier board, so that when the opening plate is moved towards the insert of the carrier board, the holding member is manipulated by the opening pin to release the held state of the semiconductor device, and when the opening plate is moved away from the insert of the carrier board, the holding member is released from the opening pin so that the held state of the semiconductor device is maintained, wherein when the manipulation of the holding member by moving the opening pin towards the insert of the carrier board to release the held state of the semiconductor device has been completed, a predetermined distance remains between the opening plate and the insert.

The opening plate may have a close contact prevention protrusion preventing a facing surface of the opening plate that faces the insert of the carrier board from coming into contact with the insert to remain at the predetermined distance therefrom.

The close contact prevention protrusion may be located at a position corresponding to a frame of the carrier board.

The predetermined distance may be greater than a thickness of the semiconductor device.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Throughout the drawings, it should be noted that like reference numbers are used to depict the same or similar elements, features, and structures embodiment of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
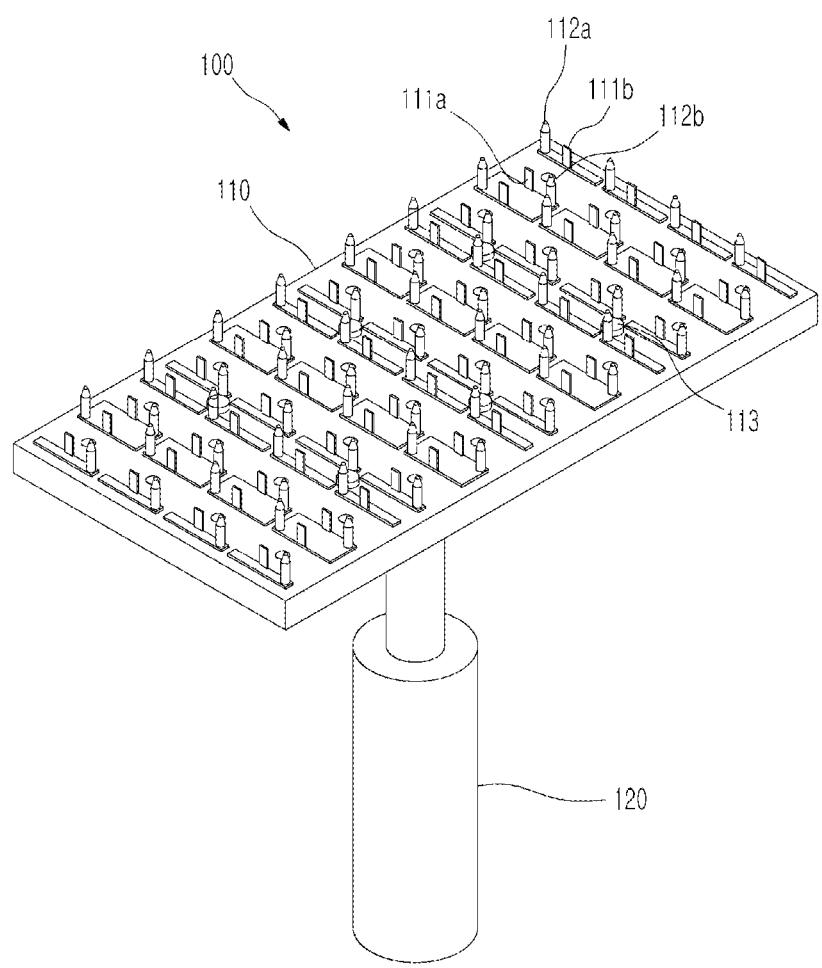
FIG. 1 is a perspective view of an opener for a test handler according to an exemplary embodiment of the present invention.

FIG. 1 is a perspective view of an opener 100 for a test handler (hereinafter referred to simply as an "opener"), according to an exemplary embodiment of the present invention.

The opener 100 is provided in each of a loading portion and an unloading portion of the test handler. As shown in FIG. 1, the opener 100 includes an opening plate 110 and a drive source 120.

The opening plate 110 has a rectangular shape. A plurality of opening pins 111a and 111b for manipulating holding members of inserts are provided in pairs on an upper surface of the opening plate 110. Furthermore, a plurality of positioning protrusions 112a and 112b are provided in pairs on the upper surface of the opening plate 110 so as to position the opening pins 111a and 111b such that the opening pins 111a and 111b can correctly manipulate the corresponding holding members.

Figure 2:
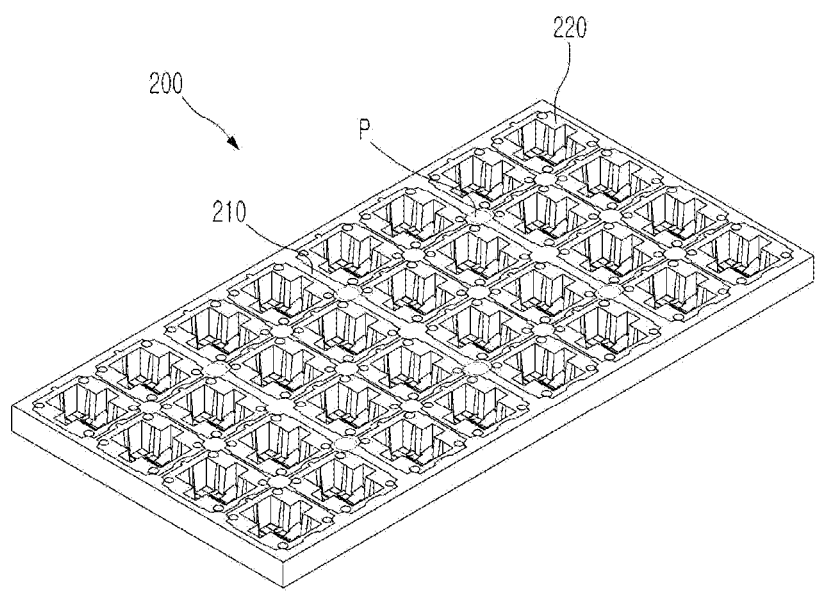
FIG. 2 is a perspective view showing a typical carrier board according to an exemplary embodiment of the present invention.

In the embodiment of the present invention, the opening plate 110 has a plurality of close contact prevention protrusions 113. The close contact prevention protrusions 113 are located at positions corresponding to a frame of a carrier board 200. In detail, as shown in FIG. 2, the carrier board 200 includes a frame 210 and inserts 220 that are installed in the frame 210. Because the close contact prevention protrusions 113 are located corresponding to points P of the frame 210, the upper surface of the opening plate 110 can be prevented from coming into direct contact with lower surfaces of the inserts 220, and even after manipulating the holding members using the opening pins 111a and 111b to release a held state has been completed, a distance corresponding to the height of the close contact prevention protrusions 113 can remain between the upper surface of the opening plate 110 and the lower surfaces of the inserts 220. Therefore, close contact force of the opening plate 110 can be prevented from being applied to the lower surfaces of the inserts 220.

Figure 3:
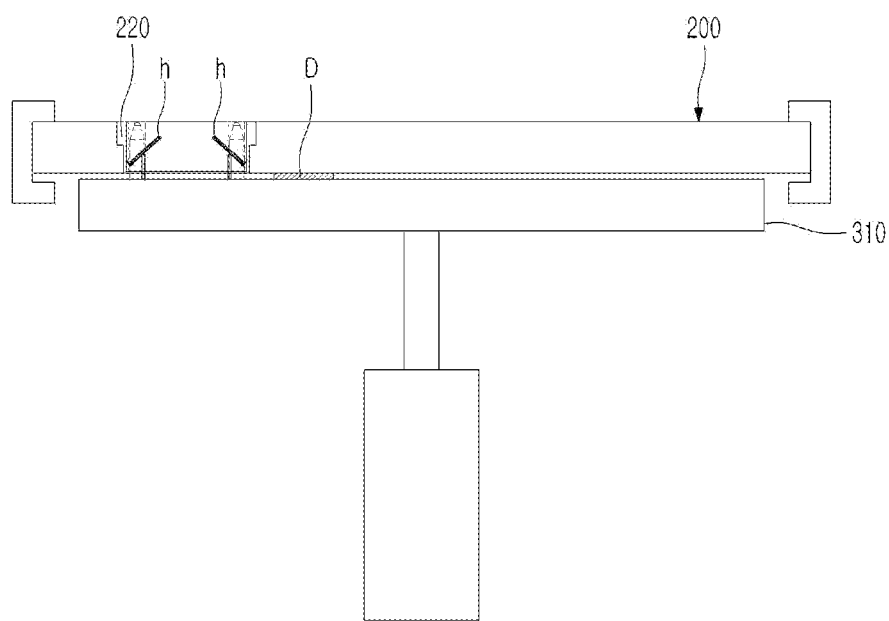
FIG. 3 is a reference view illustrating a problem occurring during a conventional loading operation due to a semiconductor device dropped on an opening plate according to an exemplary embodiment of the present invention.

Meanwhile, while the test handler is being continuously operated, a semiconductor device may occasionally undesirably drop onto the upper surface of the opening plate. In this case, in the conventional art, as shown in FIG. 3, the holding members h may malfunction because of the semiconductor device D placed on the upper surface of the opening plate 310. As such, if semiconductor devices are loaded onto the inserts 220 in this state in which the holding members h are not correctly manipulated, when the carrier board 200 moves or converts its posture (from the horizontal state to the vertical state), a problem has been caused in that the semiconductor devices that have been loaded on the carrier board 200 may pour out at once.

Figure 4:
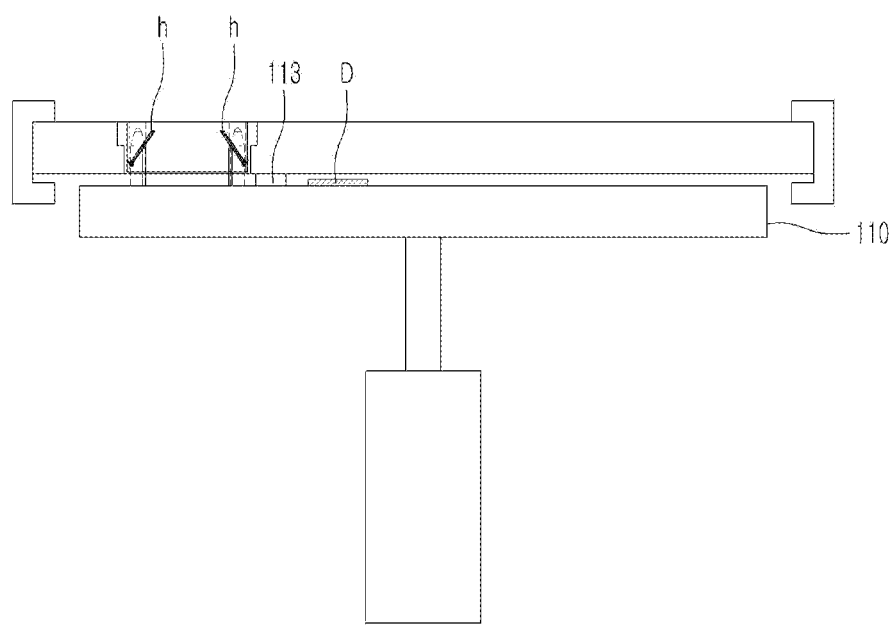
FIGS. 4 through 7 are views showing the operation of the opener of FIG. 1 according to an exemplary embodiment of the present invention.

The present invention is characterized in that even after the holding state has been released and the manipulation of the holding members h has been completed, a predetermined distance remains between the lower surfaces of the inserts 220 and the upper surface of the opening plate 110. Moreover, the present invention is configured in such a way that the height of the close contact prevention protrusions 113 for forming the predetermined distance is greater than that of the semiconductors device D so that even if the semiconductor device D is placed on the upper surface of the opening plate 110, as shown in FIG. 4, the holding members h can be correctly manipulated.

The drive source 120 provides power to lift the opening plate 110 toward the carrier board 200 or move the opening plate 110 downwards away from the carrier board 200. In this embodiment, the drive source 120 is embodied by a cylinder.

The operation of the opener 100 having the above-mentioned construction will be explained with reference to FIG. 5.

Figure 5:
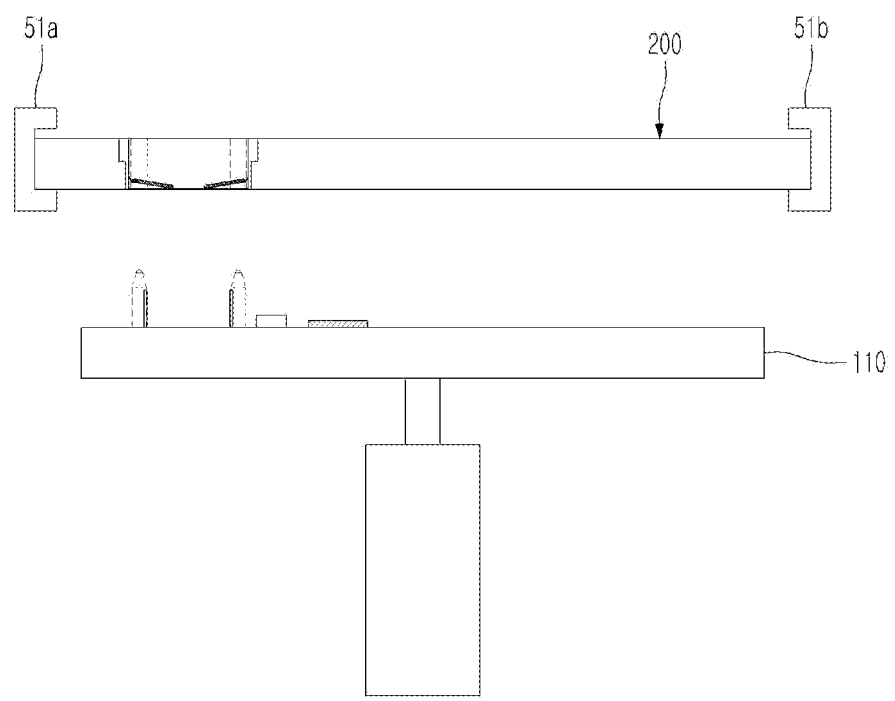
Figure 6:
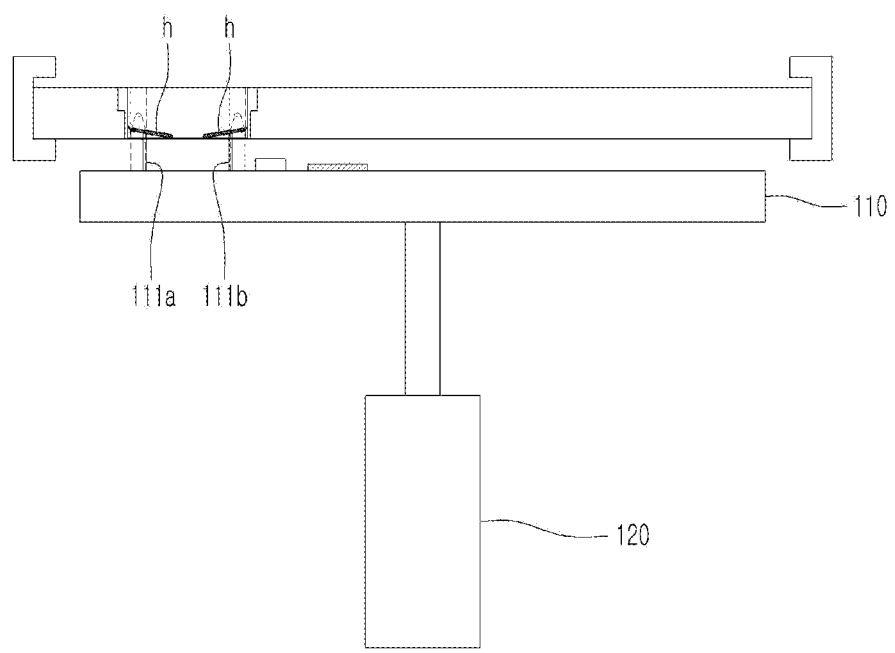

Referring to FIG. 5, an empty carrier board 200 is carried to the loading position and located above the opening plate 110. Subsequently, as shown in FIG. 6, the drive source 120 is operated to lift the opening plate 110 so as to load the semiconductor device.

Figure 7:
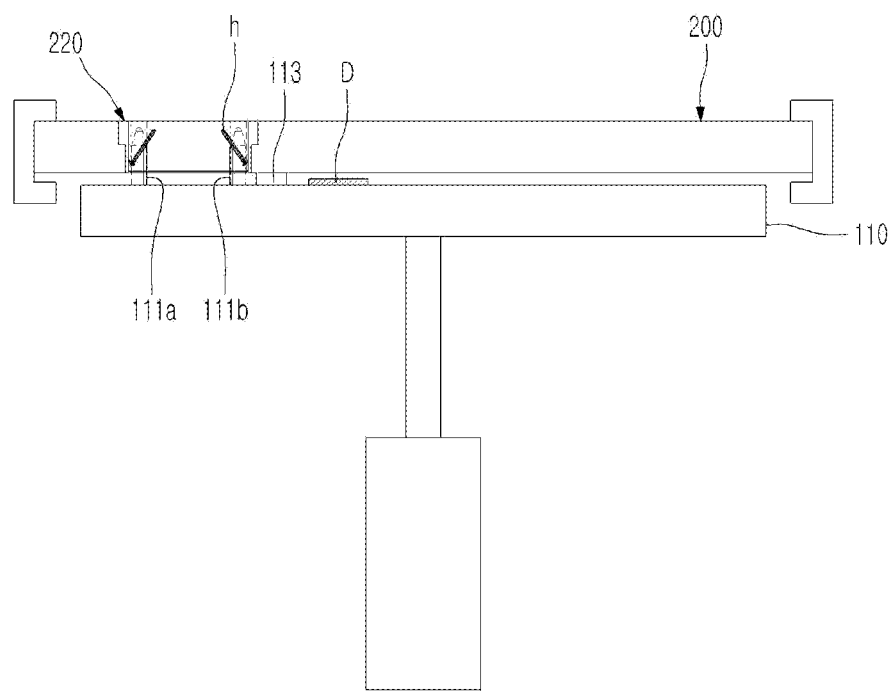

As shown in FIG. 7, the opening plate 110 is lifted until the close contact prevention protrusion 113 comes into contact with the frame 210 of the carrier board 200. That is, because both ends of the carrier board 200 are held by guide rails 51a and 51b, the carrier board 200 is restrained from moving upwards. Thus, when the close contact prevention protrusion 113 comes into contact with the frame 210 of the carrier board 200 that is restrained from moving upwards, the opening plate 110 is unavoidably stopped from being lifted. As shown in FIGS. 6 and 7 illustrating the process of lifting the opening plate 110, when the opening plate 110 is lifted, the opening pins 111a and 111b come into contact with the holding members h and thus push the free ends of the holding members h upwards. When the lift of the opening plate 110 has been completed, the opening pins 111a and 111b also stop manipulating the holding members h. At this time, a distance corresponding to the height of the close contact prevention protrusions 113 remains between the lower surfaces of the inserts 220 and the upper surface of the opening plate 110. Although a semiconductor device D is placed on the upper surface of the opening plate 110, the holding members h can be correctly manipulated by the opening pins 111a and 111b.

In the state of FIG. 7, semiconductor devices are loaded onto the inserts 220 of the carrier board 200 by a pick-and-place apparatus (not shown, an apparatus for transporting semiconductor devices). After the loading has been completed, the drive source 120 is operated to move the opening plate 110 downwards. Then, the loaded semiconductor devices are held by the corresponding holding members h.

In the case of an unloading operation, the opener is operated in the same manner as that of the loading operation. Only the unloading operation differs from the loading operation in that the pick-and-place apparatus unloads the semiconductor devices from the carrier board 200 and in that, because the semiconductor devices are already on the carrier board, there is a low probability of a semiconductor device being undesirably dropped onto the upper surface of the opening plate unlike that of the loading operation. Therefore, the detailed description of the operation of the opener 100 for the unloading operation will be omitted.

In the present invention, when unloading, the holding members of the inserts are completely pushed upwards while the upper surface of the opening plate is prevented from coming into contact with the inserts of the carrier boar. Thus, close contact force of the opening plate can be prevented from being applied to the inserts, so that a major cause of the inserts being twisted can be minimized. Thereby, the present invention can prevent a problem that the pick-and-place apparatus cannot hold a semiconductor device on the insert due to an event of a ball of the semiconductor device being held by the seating surface of the corresponding insert because of the phenomenon of the insert being twisted.

As described above, in an opener for a test handler according to the present invention, even after an operation of manipulating holding members to release a held state has been completed, an upper surface of an opening plate is prevented from coming into contact with lower surfaces of inserts. Therefore, close contact force of the opening plate is prevented from being applied to the inserts, thus preventing an insert from becoming defective, for example, being twisted, etc.

While the invention has been and described with reference to certain exemplary embodiments thereof, it will be understood by those skilled in the art that various changes in form and details may be made therein without departing from the scope and spirit of the invention as defined by the appended claims and their equivalents.

What is claimed is:
1. A test handler, the test handler comprising:
   a carrier board having an insert, the insert having a holding member to hold a semiconductor device loaded onto insert,
   an opening plate provided below the insert of the carrier board, the opening plate having an opening pin manipulating the holding member to release a held state of the semiconductor device loaded onto the insert; and
   a drive source moving the opening plate towards or away from the insert of the carrier board, so that when the opening plate is moved towards the insert of the carrier board, the holding member is manipulated by the opening pin to release the held state of the semiconductor device, and when the opening plate is moved away from the insert of the carrier board, the holding member is released from the opening pin so that the held state of the semiconductor device is maintained, wherein when the manipulation of the holding member by moving the opening pin towards the insert of the carrier board to release the held state of the semiconductor device has been completed, a predetermined distance remains between the opening plate and the insert, wherein the opening plate has a close contact prevention protrusion preventing a facing surface of the opening plate that faces the insert of the carrier board from coming into contact with the insert to remain at the predetermined distance therefrom, wherein the close contact prevention protrusion is located at a position corresponding to a frame of the carrier board, and wherein the predetermined distance is greater than a thickness of the semiconductor device, so that even if the semiconductor device is placed on the facing surface of the opening plate, the holding member is correctly manipulated.

2. The test handler as set forth in claim 1, further comprising:

guide rails configured to restrain an upper movement of the carrier board when the opening plate is lifted until the close contact provision comes into contact with the frame of the carrier board, wherein the opening plate includes a positioning protrusion on the upper surface of the opening plate so as to position the opening pin.

\* \* \* \* \*